US 8,536,874 B1

(12) United States Patent
Cho et al.

(10) Patent No.: US 8,536,874 B1
(45) Date of Patent: Sep. 17, 2013

(54) INTEGRATED CIRCUIT VOLTAGE DOMAIN DETECTION SYSTEM AND ASSOCIATED METHODOLOGY

(75) Inventors: Thomas B. Cho, Fremont, CA (US); Wai-Tat Wong, Taman Overseas Union (MY)

(73) Assignee: Marvell International Ltd., Hamilton (BM)

( * ) Notice: Subject to any disclaimer, the term of this patent is extended or adjusted under 35 U.S.C. 154(b) by 1812 days.

(21) Appl. No.: 11/407,417

(22) Filed: Apr. 20, 2006

Related U.S. Application Data

(60) Provisional application No. 60/722,197, filed on Sep. 30, 2005.

(51) Int. Cl.
*G01R 31/08* (2006.01)
(52) U.S. Cl.
USPC .......................................................... 324/522
(58) Field of Classification Search
USPC .......................... 324/522, 647, 725
See application file for complete search history.

(56) References Cited

U.S. PATENT DOCUMENTS

| | | | | |
|---|---|---|---|---|
| 4,701,639 | A * | 10/1987 | Stanojevic | 327/83 |
| 4,945,260 | A * | 7/1990 | Naghshineh et al. | 327/539 |
| 5,013,934 | A * | 5/1991 | Hobrecht et al. | 327/527 |
| 5,900,772 | A * | 5/1999 | Somerville et al. | 327/539 |
| 6,150,871 | A * | 11/2000 | Yee | 327/538 |
| 6,204,072 | B1 * | 3/2001 | Wright et al. | 438/14 |
| 6,489,688 | B1 * | 12/2002 | Baumann et al. | 257/786 |
| 6,578,185 | B1 * | 6/2003 | Kelly | 716/16 |
| 6,680,643 | B2 * | 1/2004 | Conte et al. | 327/539 |
| 6,853,238 | B1 * | 2/2005 | Dempsey et al. | 327/539 |
| 6,965,334 | B2 * | 11/2005 | May et al. | 341/144 |
| 7,078,958 | B2 * | 7/2006 | Gower et al. | 327/539 |
| 7,164,291 | B2 * | 1/2007 | Mair et al. | 326/83 |

OTHER PUBLICATIONS

Brokaw, A. Paul, A Simple Three-Terminal IC Bandgap Reference, IEEE Journal of Solid State Circuits, vol. SC-9, No. 6, 1974, p. 388-393.*

* cited by examiner

*Primary Examiner* — Thomas Valone

(57) ABSTRACT

A voltage sensing module for an integrated circuit (IC) that supports operation at a plurality of different voltage levels includes a voltage generation module that generates first and second voltages based on an operating voltage level of the IC. A comparing module receives the first and second voltages and generates a voltage determination signal based on the first and second signals. The voltage determination signal selectively configures an input/output I/O pad of the IC.

38 Claims, 9 Drawing Sheets ized circuits designed for use in multiple voltage domains.

INTEGRATED CIRCUIT VOLTAGE DOMAIN DETECTION SYSTEM AND ASSOCIATED METHODOLOGY

CROSS-REFERENCE TO RELATED APPLICATIONS

This application claims the benefit of U.S. Provisional Application No. 60/722,197, filed on Sep. 30, 2005. The disclosure of the above application is incorporated herein by reference in its entirety.

FIELD

The present invention relates to integrated circuits designed for use in multiple voltage domains.

BACKGROUND

The "background" description provided herein is for the purpose of generally presenting the context of the invention. Work of the presently named inventors, to the extent it is described in this background section, as well as aspects of the description that may not otherwise qualify as prior art at the time of filing, are neither expressly or impliedly admitted as prior art against the present invention.

Integrated circuits (ICs) are increasingly modular in construction. To this end, ICs are often configured to operate using multiple voltage domains. The different voltages may be used to power cell/blocks of the IC and may also be provided to I/O pads of the IC. For stacked I/O pads, the use of different voltage domains is typically geared toward supporting one or more I/O voltage levels. For example, an IC may operate at either 1.8V or 3.3V.

This type of pad usually requires 3.3V devices to implement the pad logic. Output drivers also need to operate at 3.3V without voltage stress. However, it is also possible to implement the pad logics and output drivers using 1.8V devices. The 1.8V devices are stacked for the output drivers to relieve the full 3.3V output voltage swing during operation. This stacked implementation saves the cost of an extra mask that would otherwise be needed to fabricate the 3.3V devices. This type of pad requires information relating to the I/O voltage level to configure the pad to a correct voltage level. Otherwise the pad will not function correctly and/or the devices may be stressed, which may cause long term reliability problems.

SUMMARY

A voltage sensing module for an integrated circuit (IC) that supports operation at a plurality of different voltage levels comprises a voltage generation module that generates first and second voltages based on an operating voltage level of the IC. A comparing module receives the first and second voltages and generates a voltage determination signal based on the first and second signals. The voltage determination signal selectively configures a pad of the IC.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
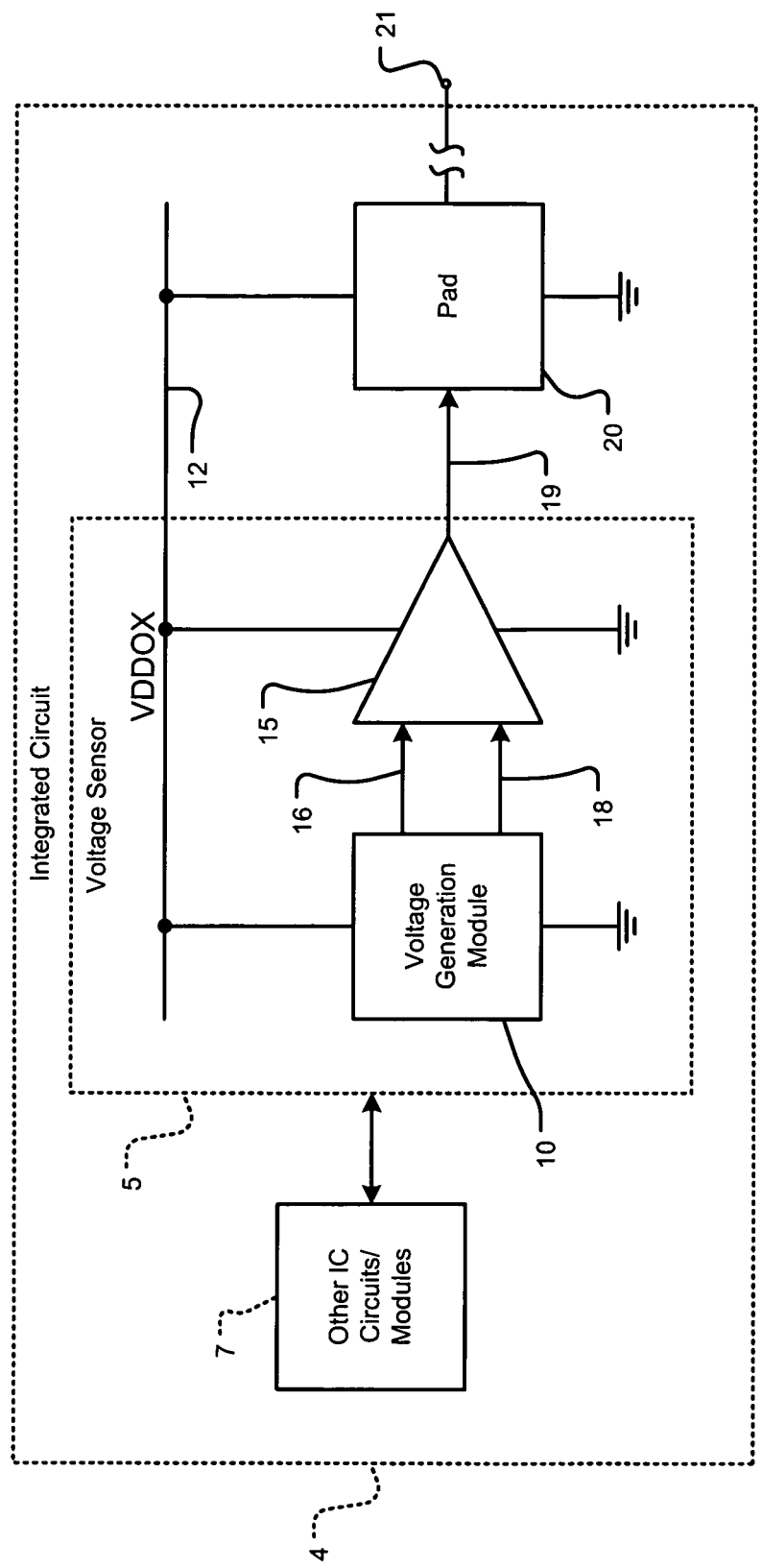
FIG. 1 is a functional block diagram of an integrated circuit package including the voltage sensor module.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

A voltage sensing module determines the voltage domain of the integrated circuit, or a portion thereof. The voltage sensing module consumes low power and is relatively insensitive to voltage stress for the voltage domains. The voltage sensing module detects the I/O voltage level and provides a detection signal to a stacked I/O pad. The I/O pad is configured for the appropriate voltage level of multi voltage domains.

A voltage generation module of the IC is provided to deliver an output voltage from the IC based on a respective one of the plurality of voltage domains. The voltage generation module provides a stable voltage across a variety of voltage domains.

The voltage sensor module detects a differential voltage of the voltage generation module. The differential voltage varies based upon a respective one of the plurality of voltage domains. The voltage sensor provides an output signal responsive to the differential voltage. The output signal identifies the respective one of the plurality of voltage domains. A pad of the IC, such as an I/O pad for example, receives the output signal to enable a corresponding output voltage terminal of the integrated circuit in accordance with the detected output voltage.

Referring now to FIG. 1, an integrated circuit (IC) 4 includes a voltage sensor module 5 and other IC circuits and/or modules 7. The voltage sensor module 5 includes a voltage generation module 10 and a comparator module 15. The IC includes a pad 20, which generally depicts bond pads formed on the IC 4. The bond pads 20 provide connectivity between terminals of the IC 4 and metal interconnects/vias of the IC 4, which in turn provide connections that are internal to the IC 4.

The IC 4 is shown operably linked to a voltage supply reference 12 providing a voltage domain VDDOX (I/O voltage) and a voltage reference such as ground. In the exemplary embodiment, VDDOX is an I/O output voltage for use with an I/O pad. Those skilled in the art will recognize that the exemplary voltage polarities and pad interconnection schemes are meant to be illustrative rather than exhaustive of the scope of application of the present invention. The comparator module 15 is operable to receive differential voltage inputs 16 and 18 from the voltage generation module 10. The differential voltage inputs vary based upon the voltage domain of (VDDOX). The comparator module 15 provides an output signal responsive to the differential voltage, which is operative to identify the voltage domain of VDDOX. The comparator module 15 provides a voltage determination signal 19 indicative of the voltage domain of VDDOX.

The exemplary I/O pad 20 is "stacked". The pad 20 receives the voltage determination signal 19 to enable a corresponding output voltage terminal 21 of the IC 4 in accordance with the detected output voltage. The IC 4 may have multiple output voltage terminals. In the exemplary embodiment, the pad 20 includes 1.8V devices for pad logics and I/O drivers, which may be stressed by a higher voltage domain, such as 3.3V. The pad 20 may include only 1.8V devices to reduce mask/processing costs. In an alternative embodiment, the voltage determination signal 19 may be used to configure the inputs or inputs/outputs of the stacked pad to work at the voltage domain of VDDOX.

Figure 2:
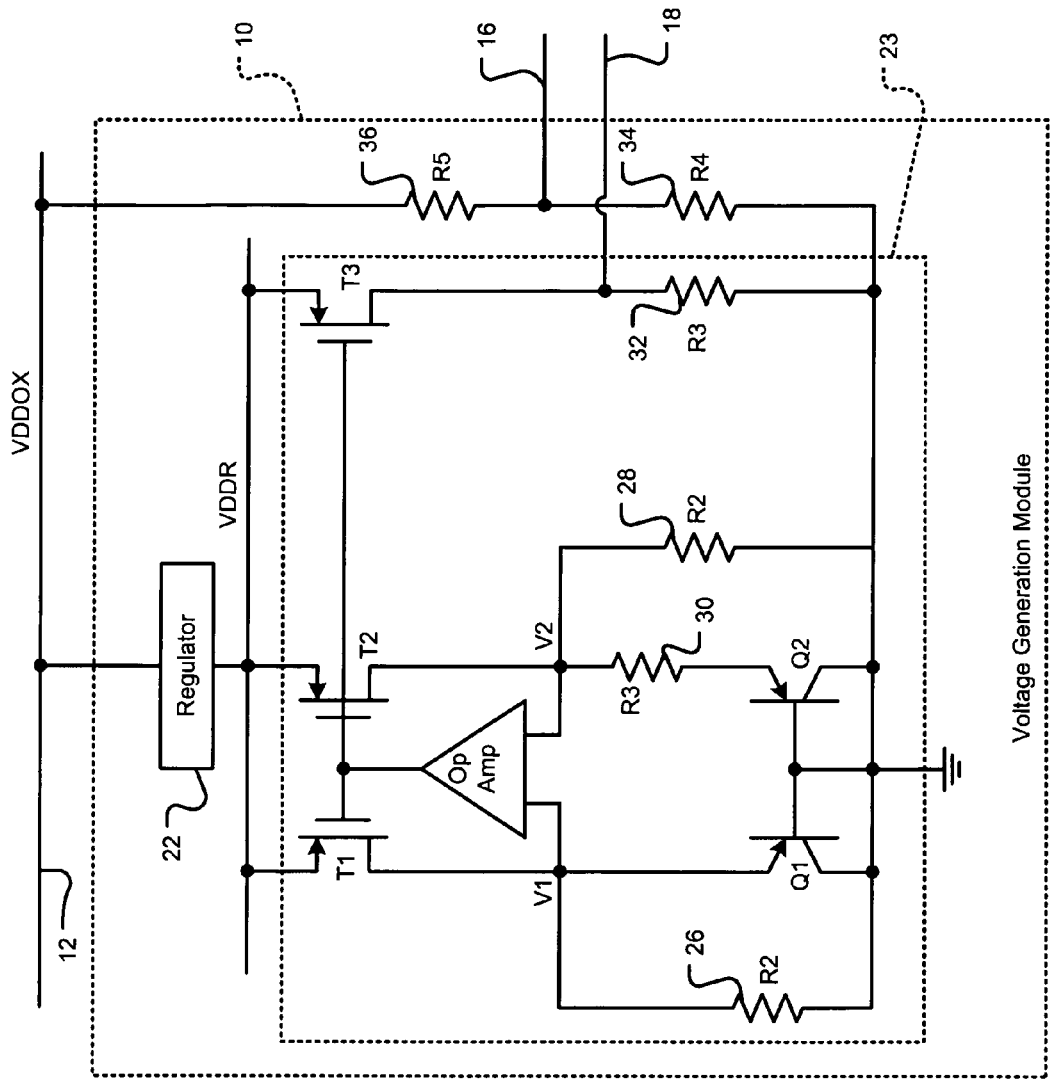
FIG. 2 is a schematic diagram of an exemplary voltage generator module of FIG. 1.

Referring now to FIG. 2, a schematic diagram of an exemplary voltage generator module is shown. The voltage generation module 10 includes a voltage regulator module 22 arranged between the voltage supply reference 12 and the voltage generation module 10. The voltage regulator module 22 protects the low voltage components of the voltage generation module 10 from the voltage domain present on the voltage supply reference 12. Those skilled in the art will recognize that the voltage regulator module 22 can be fashioned from a variety of active and passive components, a description of which is omitted here for brevity.

In this configuration, the voltage generation module 10 includes a voltage divider including resistances R5 and R4. The voltage divider provides a voltage that is proportional to VDDOX to comparator module 15.

Figure 3:
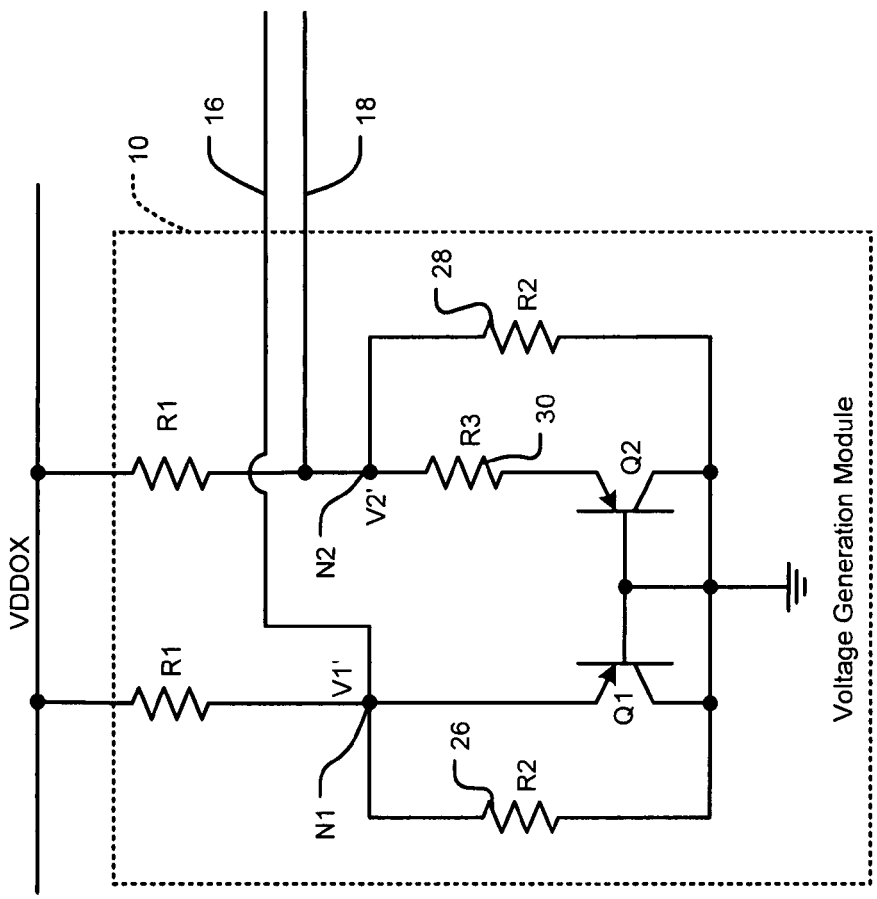
FIG. 3 is a schematic diagram of a further exemplary embodiment of the voltage generation module of FIG. 1.

The voltage generation module 10 of the embodiment shown in FIG. 3 receives a reference voltage VDDR from the voltage regulator module 22 to limit voltage stress on components of the voltage generation module 10 for high voltage domains. The exemplary voltage generation module 10 also includes a bandgap reference circuit 23. The exemplary bandgap reference circuit 23 includes first to third MOSFETs (metal oxide semiconductor field effect transistors) T1-T3, biasing resistors 24-32, having resistances R1-R3, and two BJT (bipolar junction transistor) transistors Q1 and Q2.

The sources of transistors T1-T3 are connected to VDDR of the voltage regulator module 22 for voltage stress protection. The gates of transistors T1-T3 are connected to an output of an operational amplifier (OA), which amplifies the voltage difference between V1 and V2. The drain of transistor T1 is connected to (i) a resistor 24, (ii) the emitter of transistor Q1, and (iii) one input of the OA. The drain of transistor T2 is connected to (i) another resistor 28, (ii) a resistor 30, and (iii) another input of the OA. Of course, while the exemplary voltage generation module 10 is shown with MOSFETs and BJTs of certain conductivity types (i.e., PNP, P-channel) those skilled in the art will recognize that alternative combinations of conductivity types are possible by altering the biasing arrangement.

The drain of transistor T3 is connected to a resistor 32 and the input 18 of the comparator module 15. The resistors 26, 28, the resistor 30, and the bases and the collectors of transistors Q1 and Q2 are connected to the reference potential. The transistors Q1 and Q2 are diode connected with their bases shorted to their collectors. The resistances of the resistors 26, 28 may be selected to be substantially the same.

The bandgap reference circuit 23 generates a voltage that exhibits little dependence on process parameters (for example the voltage supply level) or temperature. As previously noted, the bandgap reference circuit 23 relies on two groups (Q1 and Q2) of diode-connected BJT transistors with different emitter current densities. By canceling the negative temperature dependence of the PN junctions in one group (Q1) of transistors with the positive temperature dependence from the other group of transistors (Q2), a fixed DC voltage that does not change with temperature is generated. In this manner, voltages V1 and V2 present a sum of a growing voltage drop of one group of devices (Q1) together with the decreasing voltage drop of another group of devices (Q2) to output a stable reference for amplification by the operational amplifier (OA).

When the output of the bandgap reference circuit 23 drives transistor T3 in accordance with a voltage domain of VDDOX, the voltage drop across resistor 32 will be relatively constant. Depending upon the voltage values set by divider provided by resistors 34, 36, the comparator module 15 will indicate a result of the comparison of the voltages at 16 and 18. In the exemplary embodiment, the resistor values are set to indicate a predetermined reference voltage that is exceeded upon the application of a certain voltage domain via VDDOX.

The voltage regulator module 22 prevents high voltages from entering the voltage generation module 10. Thus, the operational amplifier OA and the MOS transistors T1-T3, which are voltage sensitive, are also protected from high voltages. When the voltage VDDOX is at a high level, the voltage regulator module 22 reduces the voltage to an appropriate lower level. When the voltage domain of VDDOX is already at a voltage that the voltage generation module 10 of FIG. 2 can handle, the voltage regulation function may be selectively disabled to allow for low voltage operation of the voltage generation module 10.

Yet, in order for the voltage regulator module 22 to protect the bandgap reference circuit 23, the voltage regulator module 22 may be configured to an initial power up voltage, which is not known. During this time, the output of the voltage regulator module 22 (VDDOX ramping up) may not be well defined and produce an incorrect reference voltage 18 for the comparator module 15.

Referring now to FIG. 3, an alternate voltage generation module 10 is shown. The voltage generation module in FIG. 3 consumes less current than the voltage generation module of FIG. 2. Instead of utilizing the operational amplifier/MOS- FET arrangement of the previous exemplary embodiment, this embodiment relies upon proportioned resistor values to generate a differential voltage at points V1' and V2' of FIG. 3. The voltage generation module 10 of FIG. 3 limits the voltages so that high voltage stresses are limited with respect to the active components of the bandgap reference circuit. The specific operation of the bandgap reference circuit is explained below with reference to differential voltage V1'-V2'.

The comparator module 15 senses whether V1' is equal to, less than, or greater than V2'. In an alternative embodiment, the sensing operation of comparator module 15 may be implemented such that a voltage offset is added to or accounted for with respect to V1' and/or V2' through an additional voltage divider applied to an input of comparator module 15 (not shown). The voltage determination signal 19 can be a binary signal in which a low or zero value indicates a low input voltage (e.g., 1.8 volts) and a high value indicates a high input voltage (e.g., 3.3 volts), or vice versa. As an alternative to a binary signal, the voltage determination signal 19 may be implemented as an analog signal, or alternatively as a digital signal having more than two values.

The node N1 is connected to the emitter of transistor Q1. The node N2 is connected to one end of the resistor 30 and one end of the resistor 25. The other end of the resistor 30 is connected to the emitter of transistor Q2. The bases of transistors Q1 and Q2 are connected to each other and to the circuit return path GRD and also to the collectors of transistors Q1 and Q2. The other ends of the resistors 26, 28 are connected also to the reference potential. Voltages V1' and V2' at nodes N1 and N2 are safe for transistors Q1 and Q2 even if the voltage supply reference 12 supplies a voltage that is above a voltage stress level of the components.

Figure 4:
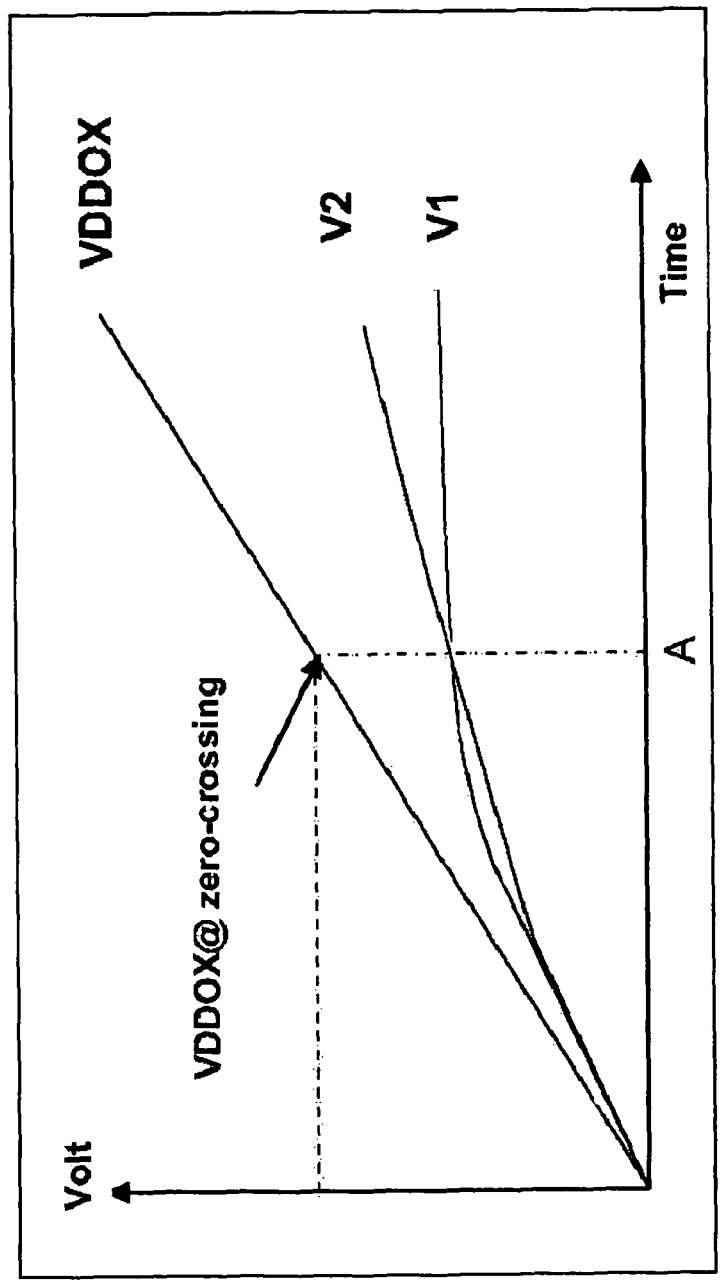
FIG. 4 is a graph showing voltage as a function of time for the voltage supply and voltages of the voltage sensor module of FIG. 3.

Referring now to FIG. 4, a graph of the voltage VDDOX is shown increasing linearly as a function of time. The voltage VDDOX is shown increasing linearly to illustrate the operation of the voltage generation module 10 of FIG. 3. During operation, the voltage VDDOX is a discrete voltage that is generally at a low value (e.g., 1.8V) or high value (e.g., 3.3V). However, VDDOX may change, be generated, or set in any desired manner, including in a non-linear manner.

As shown in FIG. 4, when the voltage VDDOX applied to the voltage generation module 10 increases from zero, voltages V1 and V2 at nodes N1 and N2, respectively, also increase from zero. The voltage V1 is initially larger than V2 due to the size difference between Q1 and Q2. As the voltage VDDOX increases to a value Vzero-crossing labeled A in FIG. 4, the voltages V1 and V2 become equal. At this time t2, the voltage VDDOX has reached a value that is defined by:

$$\begin{aligned} V_{zero\text{-}crossing} &= (R1 + R2) \cdot V1/R2 + (R1/R3) \cdot VT \cdot \ln(N) \quad (1)\\ &= ((R1 + R2)/R2) \cdot (V1 + VT \cdot \ln(N) \cdot \\ & \quad (R1/R3) \cdot R2/(R1 + R2))\\ &= ((R1 + R2)/R2) \cdot Vbandgap, \end{aligned}$$

where VT is kT/q, in which k is the Boltzmann's constant, T is the absolute temperature, q is the electron charge, and N is the ratio of the emitter areas of the two BJTs Q1 and Q2.

The Vzero-crossing is preferably substantially constant over temperature. Moreover, the Vzero-crossing is substantially constant and independent of the voltage VDDOX supplied by the voltage supply reference 12. Thus, irrespective of the voltage level supplied to the voltage generation module 10 and the comparator module 15, the Vzero-crossing remains unaffected. When the VDDOX reaches and may exceed Vzero-crossing, V2 becomes and remains larger than V1 as VDDOX increases with time.

Thus, in operation, the voltage generation module 10, as illustrated in FIG. 3, generates V1 and V2 in accordance with a voltage domain of VDDOX. The differential voltage V1-V2 is provided to comparator module 15 via lines 16 and 18, and the comparator module 15 compares V1 and V2 to determine a voltage domain of VDDOX. It is noted that for VDDOX equal to 1.8V, V1 is larger than V2, and for VDDOX equal to 3.3V, V2 is larger than V1. The comparator module 15 determines a zero-crossing of the first and second voltages V1 and V2 such that the first voltage is substantially equal to the second voltage. Also, the comparator module 15 compares the first and second voltages using a zero-crossing comparator, and determines at least one of whether the first voltage is greater than the second voltage and whether the first voltage is less than the second voltage. Thus, based on the comparison of the first and second voltages, the comparator module 15 outputs a voltage determination signal indicative of the input voltage to the pad 20. In this way, devices of pad 20, which operate in the 1.8V range will not be damaged by a 3.3V power domain.

Figure 5:
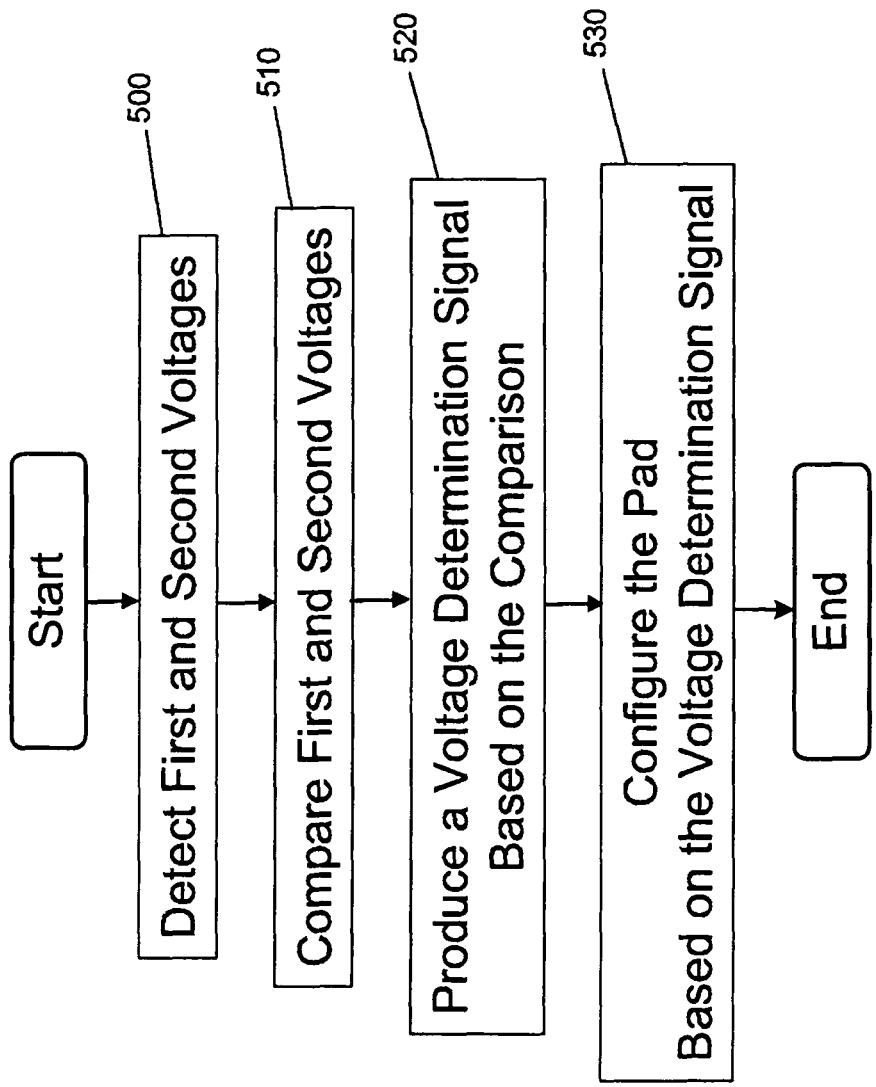
FIG. 5 is a flow chart of an exemplary voltage sensing method in accordance with the present invention.

Referring now to FIG. 5, a flowchart depicts exemplary operation of the invention. This flowchart may operate, for example, using the hardware illustrated in FIGS. 1, 2, and/or 3, or alternatively use any other desired hardware, firmware, or combinations thereof. After starting, step 500 detects the first and second voltages V1 and V2 using the input voltage. Next, step 510 compares the first voltage and the second voltage. Step 520 produces a voltage determination signal (e.g., 19) corresponding to the input voltage based on a result of the comparing step 510. Step 530 provides the determination signal to pad 20 to operate at a voltage level corresponding to the voltage determination signal.

Figure 6B:
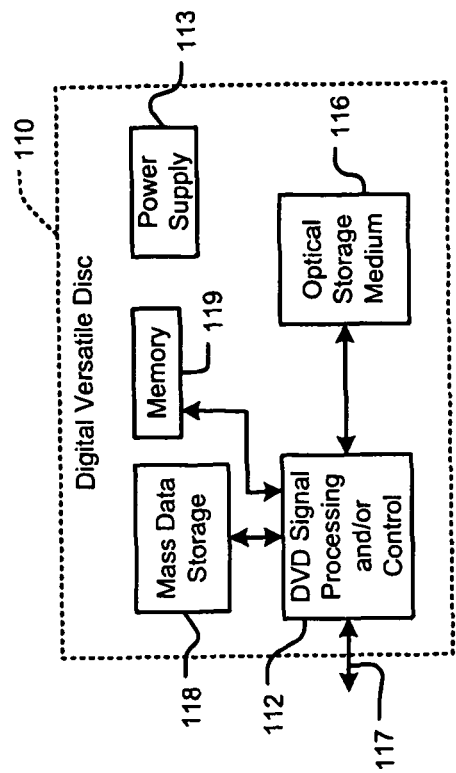
FIG. 6B is a functional block diagram of a digital versatile disk (DVD) in accordance with an exemplary embodiment of the invention.
Figure 6A:
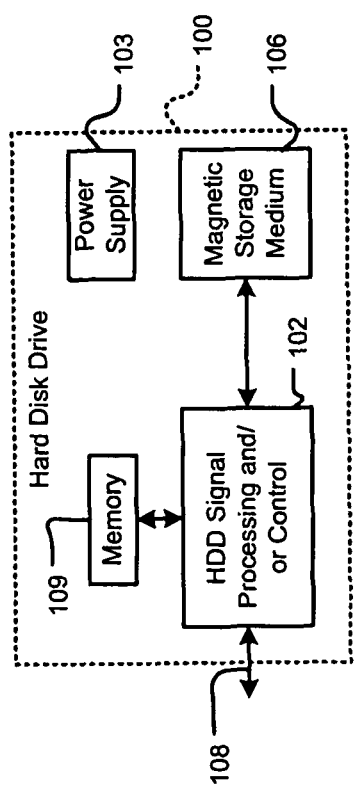
FIG. 6A is a functional block diagram of a hard disk drive in accordance with an exemplary embodiment of the invention.

Referring now to FIGS. 6A-6G, various exemplary implementations of the present invention are shown. Referring now to FIG. 6A, the present invention can be implemented in a hard disk drive 100. The present invention may implement and/or be implemented in control circuits and/or a voltage supply 103, which are generally identified in FIG. 6A at 102. In some implementations, the signal processing and/or control circuit 102 and/or other circuits (not shown) in the HDD 100 may process data, perform coding and/or encryption, perform calculations, and/or format data that is output to and/or received from a magnetic storage medium 106.

The HDD 100 may communicate with a host device (not shown) such as a computer, mobile computing devices such as personal digital assistants, cellular phones, media or MP3 players and the like, and/or other devices via one or more wired or wireless communication links 108. The HDD 100 may be connected to memory 109 such as random access memory (RAM), low latency nonvolatile memory such as flash memory, read only memory (ROM) and/or other suitable electronic data storage.

Referring now to FIG. 6B, the present invention can be implemented in a digital versatile disc (DVD) drive 110. The present invention may implement and/or be implemented in either or both signal processing and/or control circuits, which are generally identified in FIG. 6B at 112, mass data storage of the DVD drive 110 and/or a voltage supply 113. The signal processing and/or control circuit 112 and/or other circuits (not shown) in the DVD 110 may process data, perform coding and/or encryption, perform calculations, and/or format data that is read from and/or data written to an optical storage medium 116. In some implementations, the signal processing and/or control circuit 112 and/or other circuits (not shown) in the DVD 110 can also perform other functions such as encoding and/or decoding and/or any other signal processing functions associated with a DVD drive.

The DVD drive 110 may communicate with an output device (not shown) such as a computer, television or other device via one or more wired or wireless communication links 117. The DVD 110 may communicate with mass data storage 118 that stores data in a nonvolatile manner. The mass data storage 118 may include a hard disk drive (HDD). The HDD may have the configuration shown in FIG. 6A. The HDD may be a mini HDD that includes one or more platters having a diameter that is smaller than approximately 1.8". The DVD 110 may be connected to memory 119 such as RAM, ROM, low latency nonvolatile memory such as flash memory and/or other suitable electronic data storage.

Figure 6D:
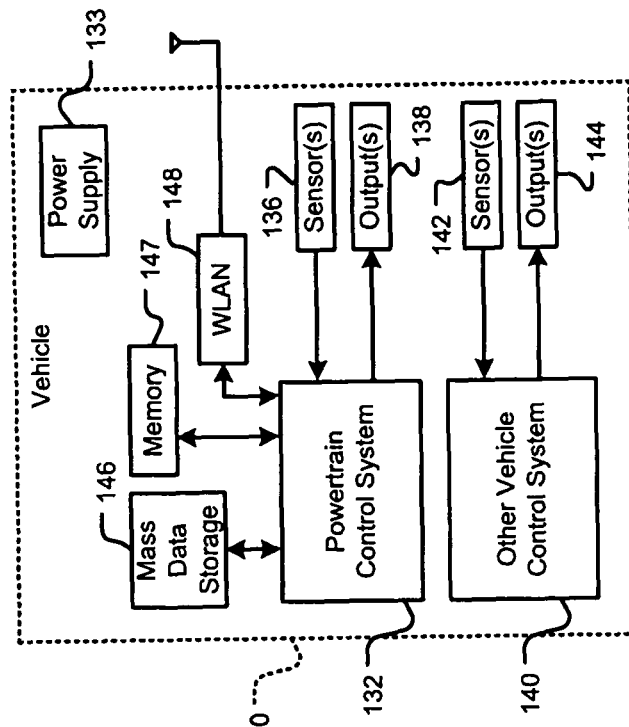
FIG. 6D is a functional block diagram of a vehicle control system in accordance with an exemplary embodiment of the invention.
Figure 6C:
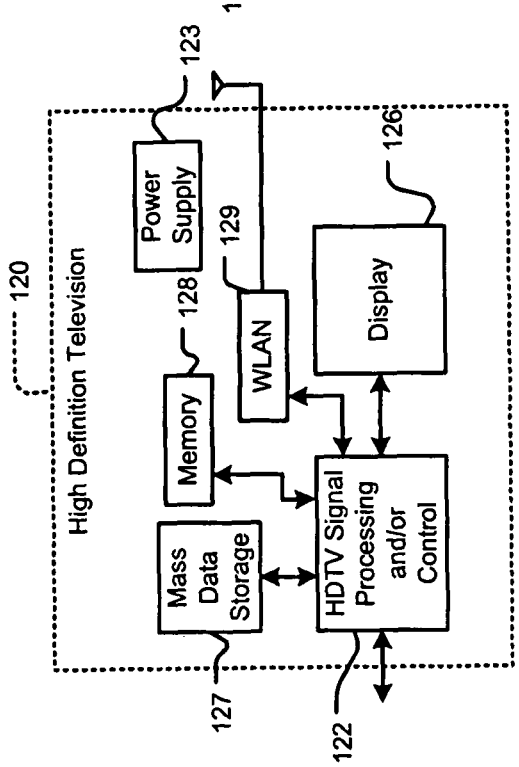
FIG. 6C is a functional block diagram of a high definition television in accordance with an exemplary embodiment of the invention.

Referring now to FIG. 6C, the present invention can be implemented in a high definition television (HDTV) 120. The present invention may implement and/or be implemented in control circuits, which are generally identified in FIG. 6E at 122, a WLAN interface, mass data storage of the HDTV 120 and/or a voltage supply 123. The HDTV 120 receives HDTV input signals in either a wired or wireless format and generates HDTV output signals for a display 126. In some implementations, signal processing circuit and/or control circuit 122 and/or other circuits (not shown) of the HDTV 120 may process data, perform coding and/or encryption, perform calculations, format data and/or perform any other type of HDTV processing that may be required.

The HDTV 120 may communicate with mass data storage 127 that stores data in a nonvolatile manner such as optical and/or magnetic storage devices. At least one HDD may have the configuration shown in FIG. 6A and/or at least one DVD may have the configuration shown in FIG. 6B. The HDD may be a mini HDD that includes one or more platters having a diameter that is smaller than approximately 1.8". The HDTV 120 may be connected to memory 128 such as RAM, ROM, low latency nonvolatile memory such as flash memory and/or other suitable electronic data storage. The HDTV 120 also may support connections with a WLAN via a WLAN network interface 129.

Referring now to FIG. 6D, the present invention may implement and/or be implemented in a control system of a vehicle 130, a WLAN interface, mass data storage of the vehicle control system and/or a voltage supply 133. In some implementations, the present invention implement a powertrain control system 132 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 140 of the vehicle 130. The control system 140 may likewise receive signals from input sensors 142 and/or output control signals to one or more output devices 144. In some implementations, the control system 140 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 132 may communicate with mass data storage 146 that stores data in a nonvolatile manner. The mass data storage 146 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The powertrain control system 132 may be connected to memory 147 such as RAM, ROM, low latency nonvolatile memory such as flash memory and/or other suitable electronic data storage. The powertrain control system 132 also may support connections with a WLAN via a WLAN network interface 148. The control system 140 may also include mass data storage, memory and/or a WLAN interface (all not shown).

Figure 6E:
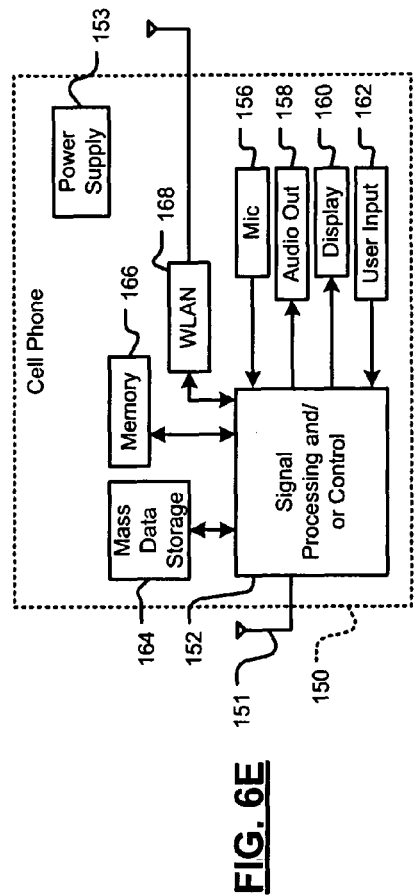
FIG. 6E is a functional block diagram of a cellular phone in accordance with an exemplary embodiment of the invention.

Referring now to FIG. 6E, the present invention can be implemented in a cellular phone 150 that may include a cellular antenna 151. The present invention may implement and/or be implemented in either or both signal processing and/or control circuits, which are generally identified in FIG. 6E at 152, a WLAN interface, mass data storage of the cellular phone 150 and/or a voltage supply 153. In some implementations, the cellular phone 150 includes a microphone 156, an audio output 158 such as a speaker and/or audio output jack, a display 160 and/or an input device 162 such as a keypad, pointing device, voice actuation and/or other input device. The signal processing and/or control circuits 152 and/or other circuits (not shown) in the cellular phone 150 may process data, perform coding and/or encryption, perform calculations, format data and/or perform other cellular phone functions.

The cellular phone 150 may communicate with mass data storage 164 that stores data in a nonvolatile manner such as optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The cellular phone 150 may be connected to memory 166 such as RAM, ROM, low latency nonvolatile memory such as flash memory and/or other suitable electronic data storage. The cellular phone 150 also may support connections with a WLAN via a WLAN network interface 168.

Figure 6F:
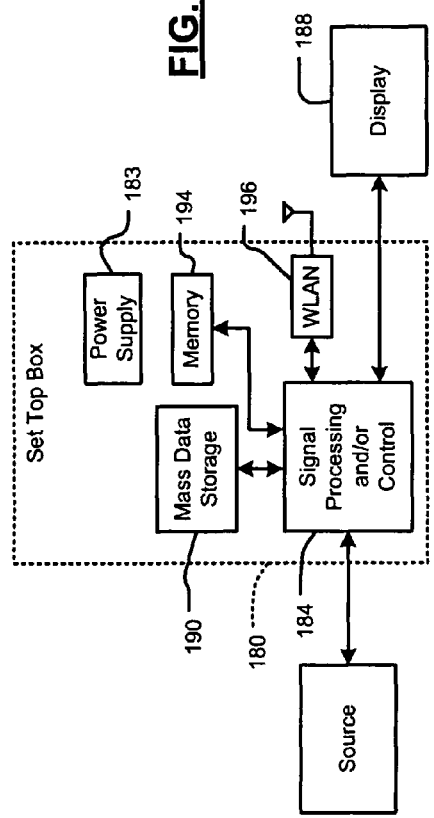
FIG. 6F is a functional block diagram of a set top box in accordance with an exemplary embodiment of the invention.

Referring now to FIG. 6F, the present invention can be implemented in a set top box 180. The present invention may implement and/or be implemented in control circuits, which are generally identified in FIG. 6F at 184, a WLAN interface, mass data storage of the set top box 180 and/or a voltage supply 183. The set top box 180 receives signals from a source such as a broadband source and outputs standard and/or high definition audio/video signals suitable for a display 188 such as a television and/or monitor and/or other video and/or audio output devices. The signal processing and/or control circuits 184 and/or other circuits (not shown) of the set top box 180 may process data, perform coding and/or encryption, perform calculations, format data and/or perform any other set top box function.

The set top box 180 may communicate with mass data storage 190 that stores data in a nonvolatile manner. The mass data storage 190 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The set top box 180 may be connected to memory 194 such as RAM, ROM, low latency nonvolatile memory such as flash memory and/or other suitable electronic data storage. The set top box 180 also may support connections with a WLAN via a WLAN network interface 196.

Figure 6G:
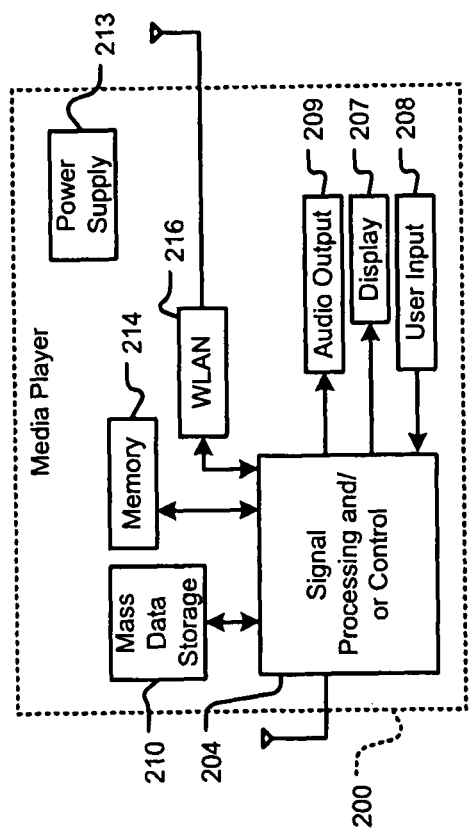
FIG. 6G is a functional block diagram of a media player in accordance with an exemplary embodiment of the invention.

Referring now to FIG. 6G, the present invention can be implemented in a media player 200. The present invention may implement and/or be implemented in either or both signal processing and/or control circuits, which are generally identified in FIG. 6G at 204, a WLAN interface, mass data storage of the media player 200 and/or a voltage supply 203. In some implementations, the media player 200 includes a display 207 and/or a user input 208 such as a keypad, touchpad and the like. In some implementations, the media player 200 may employ a graphical user interface (GUI) that typically employs menus, drop down menus, icons and/or a point-and-click interface via the display 207 and/or user input 208. The media player 200 further includes an audio output 209 such as a speaker and/or audio output jack. The signal processing and/or control circuits 204 and/or other circuits (not shown) of the media player 200 may process data, perform coding and/or encryption, perform calculations, format data and/or perform any other media player function.

The media player 200 may communicate with mass data storage 210 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The media player 200 may be connected to memory 214 such as RAM, ROM, low latency nonvolatile memory such as flash memory and/or other suitable electronic data storage. The media player 200 also may support connections with a WLAN via a WLAN network interface 216. Still other implementations in addition to those described above are contemplated.

Obviously, readily discernible modifications and variations of the present invention are possible in light of the above teachings. It is therefore to be understood that within the scope of the appended claims, the invention may be practiced otherwise than as specifically described herein. For example, while described in terms of discrete components interactively cooperating, it is contemplated that the system described herein may be practiced entirely in software. The software may be embodied in a carrier such as magnetic or optical disks, or a radio frequency or audio frequency carrier wave.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A voltage sensing module for an integrated circuit (IC) that supports operation at a plurality of different voltage domain levels, comprising:
    a voltage generation module that generates a first differential voltage output and that includes a bandgap reference module that generates a second differential voltage output based on a preset voltage domain level of said plurality of different voltage domain levels; and
    a comparing module that receives the first and second differential voltage outputs and that generates a voltage determination signal based on the first and second differential voltage outputs, wherein the voltage determination signal selectively configures an input/output (I/O) pad of the IC to operate at said preset voltage domain level.

2. An IC comprising the voltage sensing module of claim 1 and further comprising the pad, wherein the pad receives the voltage determination signal and selectively enables one of a plurality of output voltage terminals of the IC based on the voltage determination signal.

3. The voltage sensing module of claim 1 wherein the I/O pad includes a stacked I/O pad.

4. The voltage sensing module of claim 1 wherein the bandgap reference module includes:
    first and second transistors having first terminals, second terminals and control terminals;
    a first resistance having one end that communicates with the first terminal of the first transistor and another end that communicates with the operating voltage domain level of the IC;
    a second resistance having one end that communicates with the operating voltage domain level of the IC; and
    a third resistance having one end that communicates with another end of the second resistance and another end that communicates with the first terminal of the second transistor, wherein the first and second differential voltage outputs are generated at the first terminal of the first transistor and another end of the second resistance, respectively.

5. The voltage sensing module of claim 4 further comprising:
    a fourth resistance having one end that communicates with the first terminal of the first transistor and another end that communicates with the second terminal of the first transistor; and
    a fifth resistance having one end that communicates with the another end of the second resistance and another end that communicates with the second terminal of the second transistor.

6. The voltage sensing module of claim 4 wherein the third and fourth transistors are bipolar junction transistors.

7. A voltage sensing module for an integrated circuit (IC) that supports operation at a plurality of different voltage domain levels, comprising:
    voltage generation means for generating a first differential voltage output and that includes a bandgap reference means for generating a second differential voltage output based on a preset voltage domain level of said plurality of different voltage domain levels; and
    comparing means for determining a difference between the first and second voltage outputs and for generating a voltage determination signal based on the first and second voltages,
    wherein the voltage determination signal selectively configures an input/output (I/O) pad of the IC to operate at said preset voltage domain level.

8. The voltage sensing module of claim 7 wherein the voltage generation means includes bandgap reference means for generating the first and second differential voltage outputs.

9. The voltage sensing module of claim 7 wherein the I/O pad includes a stacked I/O pad.

10. The voltage sensing module of claim 8 wherein the bandgap reference means includes:
    first and second transistors having first terminals, second terminals and control terminals;
    first resistance means for providing resistance and having one end that communicates with the first terminal of the first transistor and another end that communicates with the operating voltage domain level of the IC;

second resistance means for providing resistance and having one end that communicates with the operating voltage domain level of the IC; and third resistance means for providing resistance and having one end that communicates with another end of the second resistance and another end that communicates with the first terminal of the second transistor, wherein the first and second differential voltage outputs are generated at the first terminal of the first transistor and the another end of the second resistance, respectively.

11. The voltage sensing means of claim 10 further comprising:

fourth resistance means for providing resistance having one end that communicates with the first terminal of the first transistor and another end that communicates with the second terminal of the first transistor; and fifth resistance means for providing resistance having one end that communicates with the another end of the second resistance means and another end that communicates with the second terminal of the second transistor.

12. The voltage sensing module of claim 10 wherein the third and fourth transistors are bipolar junction transistors.

13. An IC comprising the voltage sensing module of claim 7 and further comprising the pad, wherein the pad receives the voltage determination signal and selectively enables one of a plurality of output voltage terminals of the IC based on the voltage determination signal.

14. The voltage sensing module of claim 1 wherein said non-ground potential first and second voltages are non-zero voltage levels.

15. The voltage sensing module of claim 7 wherein said comparing means in determining a difference between the first and second voltages subtracts the first and second voltages.

16. A voltage sensing module for an integrated circuit (IC) that supports operation at a plurality of different non-ground potential voltage levels, comprising:

a voltage generation module that generates a first differential voltage output and that includes a bandgap reference module that generates a second differential voltage output based on an operating voltage domain level of the IC from said plurality of different non-ground potential voltage levels; and a comparing module that receives the first and second voltages and that generates a voltage determination signal based on the first and second differential voltage outputs, wherein the voltage determination signal selectively configures an input/output (I/O) pad of the IC such that devices of said I/O pad operate at said operating voltage domain level.

17. A voltage sensing module for an integrated circuit (IC) that supports operation at a plurality of different voltage domain levels, comprising:

a voltage generation module that comprises:

a bandgap reference circuit generating a first voltage based on an operating voltage domain level of the IC; and a voltage divider that is independent of said bandgap reference circuit and that generates a second voltage based on said operating voltage level; and a comparing module that receives the first and second voltages and that generates a voltage determination signal based on the first and second voltages, wherein the voltage determination signal selectively configures an input/output (I/O) pad of the IC.

18. A voltage sensing module as in claim 7 wherein said comparing means generates said voltage determination signal to selectively configure said I/O pad to operate at one of a plurality of different non-reference ground potential voltage levels.

19. The voltage sensing module of claim 1 further comprising said I/O pad, wherein said I/O pad operates in a first voltage domain or a second voltage domain based on said voltage determination signal.

20. The voltage sensing module of claim 19 wherein devices of said I/O pad are configured to operate in said first voltage domain or said second voltage domain based on said voltage determination signal.

21. The voltage sensing module of claim 1 further comprising a voltage domain reference, wherein said voltage generation module receives said preset voltage domain level from said voltage domain reference.

22. The voltage sensing module of claim 21 further comprising said I/O pad, wherein devices of said I/O pad are configured to operate at said preset voltage domain level based on said voltage determination signal.

23. The voltage sensing module of claim 1 wherein said voltage determination signal has a first state and a second state, and wherein said I/O pad operates at a first voltage domain level when said voltage determination signal is in said first state and operates at a second voltage domain level when said voltage determination signal is in said second state.

24. The voltage sensing module of claim 1 further comprising a voltage regulator that has an active state and a deactive state and has an output voltage, wherein said voltage generation module generates said first and second differential voltages based on said output voltage.

25. The voltage sensing module of claim 24 wherein said voltage regulator reduces said preset voltage domain level to a reference voltage when in said active state, and wherein said voltage generation module generates said first and second differential voltages based on said reference voltage.

26. The voltage sensing module of claim 24 wherein said voltage generation module generates said first and second differential voltages based on said preset voltage domain level when said voltage regulator is in said deactive state.

27. The voltage sensing module of claim 1 wherein said voltage determination signal is a binary signal that indicates said preset voltage domain level.

28. The voltage sensing module of claim 4 wherein said first transistor is different in size than said second transistor.

29. The voltage sensing module of claim 4 wherein voltage at the first terminal of the first transistor and voltage at the first terminal of the second transistor are equal when the preset voltage domain level is approximately equal to a zero-crossing voltage, and wherein said zero-crossing voltage is equal to a bandgap voltage multiplied by a sum of said first resistance and said second resistance divided by said second resistance.

30. The voltage sensing module of claim 4 wherein voltage at the first terminal of the first transistor and voltage at the first terminal of the second transistor are equal when the preset voltage domain level is approximately equal to a zero-crossing voltage, and wherein said zero-crossing voltage satisfies the following relationship:

$$\text{zero-crossing voltage} = (R1+R2)*V1/R2+(R1/R3)*VT*\ln(N),$$

where R1 is said first resistance, R2 is said second resistance, R3 is said third resistance, V1 is a voltage at said first terminal of said first transistor, VT is equal to Boltzmann's constant multiplied by a temperature divided by an electron charge, and N is a ratio of emitter areas of said first transistor and said second transistor.

31. The voltage sensing module of claim 24 wherein said bandgap reference module generates said second differential voltage output based on said output of said voltage regulator, wherein the voltage generation module provides said preset voltage domain level to said bandgap reference module.

32. A method of operating a voltage sensing module for an integrated circuit (IC) that supports operation at a plurality of different voltage domain levels comprising:
sensing a voltage level of a preset voltage domain reference comprising:
generating a first differential voltage output via a bandgap reference module;
generating said first differential voltage output and a second differential voltage output based on said preset voltage domain reference selected from one of the plurality of different voltage domain levels; and
generating a voltage determination signal based on the first and second differential voltage outputs; and
selectively configuring an input/output (I/O) pad of the IC to operate at said voltage level based on said voltage determination signal,
wherein the plurality of different voltage domain levels each have a voltage potential that is greater than zero.

33. The method of claim 32 wherein generating said first and second differential voltage outputs comprises:
providing first and second transistors having first terminals, second terminals and control terminals;
providing a first resistance coupled between said preset voltage domain reference and said first transistor;
providing a second resistance coupled between said preset voltage domain reference and said second transistor;
providing a third resistance coupled between said second resistance and said second transistor;
generating said first differential voltage output via said first transistor; and
generating said second differential voltage output via said second transistor.

34. The method of claim 32 comprising:
generating said first differential voltage output based on said preset voltage domain reference;
generating said second differential voltage output based on said preset voltage domain reference via a voltage divider; and
generating said voltage determination signal based on a differential voltage provided by said first differential voltage output and said second differential voltage output.

35. A method of configuring an integrated circuit (IC) that supports operation at a plurality of different voltage domain levels comprising:
selectively coupling an integrated circuit to one of a first voltage domain reference that has a first voltage domain level and a second voltage domain reference that has a second voltage domain level that is different than said first voltage domain level; and
selectively configuring an input/output (I/O) pad of said integrated circuit based on said selective coupling.

36. The method of claim 35 wherein said selectively configuring comprises one of generating a first voltage determination signal based on said first voltage domain level and generating a second voltage determination signal based on said second voltage domain level.

37. The method of claim 35 wherein said second voltage domain level is greater than said first voltage domain level.

38. The method of claim 35 wherein selectively configuring an input/output (I/O) pad of said integrated circuit comprises:
generating a first differential voltage output based on a selected one of said first voltage domain level and said second voltage domain level via a bandgap reference module;
generating a second differential voltage output based on said selected one of said first voltage domain level and said second voltage domain level via a voltage divider; and
generating a voltage determination signal based on a differential voltage provided by said first differential voltage output and said second differential voltage output.

* * * * *